(12) United States Patent
Seto

(10) Patent No.: US 6,376,912 B1
(45) Date of Patent: *Apr. 23, 2002

(54) COMMON MODE CHOKE COIL OF THE CONDUCTOR/INSULATOR STACKED TYPE THAT USES A HIGH MACHINABILITY SUBSTRATE AND BENZOCYCLOBUTENE AS THE INSULATOR

(75) Inventor: Kazuhiro Seto, Miyagi (JP)

(73) Assignee: Tokin Corporation, Miyagi (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/298,437

(22) Filed: Apr. 23, 1999

Related U.S. Application Data

(62) Division of application No. 08/826,094, filed on Mar. 28, 1997.

(30) Foreign Application Priority Data

Mar. 29, 1996 (JP) ............................................. 8-103700

(51) Int. Cl.$^7$ .......................... H01L 23/48; H01L 23/52; H01L 29/40
(52) U.S. Cl. ....................................... 257/760; 257/700
(58) Field of Search ................................ 257/700, 760; 438/622, 624

(56) References Cited

U.S. PATENT DOCUMENTS

| | | | |
|---|---|---|---|
| 4,653,186 A | 3/1987 | Kamijo et al. | |
| 4,904,967 A | 2/1990 | Morii et al. | |
| 5,099,372 A | 3/1992 | Kadokura et al. | |
| 5,126,707 A | 6/1992 | Ikeda | |
| 5,300,903 A | 4/1994 | Okamura | |
| 5,404,118 A | 4/1995 | Okamura et al. | |
| 5,508,881 A | * 4/1996 | Stevens | 361/305 |
| 5,552,756 A | * 9/1996 | Ushiro | 336/200 |
| 5,616,960 A | 4/1997 | Noda et al. | |

FOREIGN PATENT DOCUMENTS

| | | |
|---|---|---|
| DE | 42 21 021 | 6/1991 |
| EP | 0 552 058 | 7/1993 |
| EP | 0 720 2356 | 12/1993 |
| JP | 2-296025 | 10/1990 |
| JP | 05055062 A | * 3/1993 |
| JP | 5-343606 | 12/1993 |
| JP | 1-340730 | 12/1999 |

\* cited by examiner

Primary Examiner—Howard Weiss
(74) Attorney, Agent, or Firm—Morgan, Lewis & Bockius, LLP

(57) ABSTRACT

An electronic component comprises an insulator substrate (11), a layered member composed of a plurality of insulator resin layers (12a–12f) and a plurality of conductor pattern layers (13a–13f) alternately stacked on the insulator substrate to form a first conductor line and a second conductor line each of which comprises at least one conductor layer, first and second external electrode terminal portions connected to opposite ends of the first conductor line and covering first and second areas of side surfaces of said layered member and the insulator substrate, respectively, and a third external electrode terminal portion connected to one end of the second conductor line and covering a third area of the side surfaces of the layered member and the insulator substrate. The second conductor lines have magnetic and electrocapacitive coupling with respect to the first conductor line.

12 Claims, 11 Drawing Sheets

COMMON MODE CHOKE COIL OF THE CONDUCTOR/INSULATOR STACKED TYPE THAT USES A HIGH MACHINABILITY SUBSTRATE AND BENZOCYCLOBUTENE AS THE INSULATOR

BACKGROUND OF THE INVENTION

This is a division of application Ser. No. 08/826,094, filed Mar. 28, 1997.

This invention relates to an electronic component and, in particular, to an electronic component 2 of a surface-mounted type or a leaded type such as an inductor (L), a capacitor (C), an electric resistance element (R), a thin film EMI filter, a common mode choke coil, a current sensor, a signal transformer, and a composite electronic component comprising an integral combination of the above-mentioned electronic components.

A conventional multilayer interconnection board is disclosed in Japanese Unexamined Patent Publication (JP-A) No. 4-167596 (167596/1992) (Reference 1). As shown in FIG. 1, the multilayer interconnection board comprises a ceramics substrate 51 mainly containing silicon, alumina, and the like, and a conductive interconnection layer 52 comprising Cu formed on a predetermined region of the ceramics substrate 51. Then, an entire surface of the ceramics substrate 51 and the conductive interconnection layer 52 is coated with an insulator resin layer 53 of benzocyclobutene (BCB). After a photo resist pattern is formed on the insulator resin layer 53, the insulator resin layer 53 of BCB is etched to form via holes 54. After the via holes 54 are formed, a Cu film is overlaid an entire surface by sputtering and then etched. Alternatively, after a Cr or Ti film is overlaid the entire surface by sputtering, a Cu sputtered film or a Cu or Au or Al plated film is formed to thereby provide a conductive interconnection layer 55.

On the other hand, Japanese Unexamined Patent Publication (JP-A) No. 3-201417 (201417/1991) (Reference 2) discloses an electronic component of the type illustrated in FIG. 2. The electronic component comprises an insulator substrate 101 of, for example, alumina. On the insulator substrate 101, an insulator resin layer 102 of polyimide resin and internal conductor patterns 103 and 104 of Ti, Ti-Ag, or Ag formed by sputtering are alternately stacked. Then, an end portion of the insulator resin layer 102 is removed to expose an end portion of the uppermost conductor pattern 104. Thus, a high frequency coil 100 is formed as the electronic component.

Practically, a terminal underlayer portion is formed on the side surface of the electronic component so as to connect with the end portion of the conductor pattern 104. The terminal underlayer portion is covered with a conductor layer which extends from an end of the upper surface through the side surface to an end of the lower surface of the component. Thus, an external electrode terminal portion is formed.

Reference 1 describes the multilayer interconnection board which is neither an electronic component as a circuit element nor an electronic component having a plurality of circuit elements.

On the other hand, when the electronic component of the type disclosed in Reference 2 is manufactured, the insulator layers and the conductor layers for a plurality of the electronic components are alternately stacked on different portions of the insulator substrate of a relatively large size. Thus, a plurality of the electronic components are formed on the single insulator substrate. Thereafter, the insulator substrate is cut to separate the individual electronic components. However, since the insulator substrate comprises a very hard material such as alumina, cutting cost is high in the cutting process. In addition, occurrence of chipping of the insulator substrate results in high fraction defective and low yielding percentage.

In the above-mentioned structure, the irregularity of the underlying conductor pattern layer reflects or is reproduced on the surface of the insulator resin layer formed thereon. This results in the unevenness of the overlying conductor pattern layer stacked on the insulator resin layer. In this event, a desired characteristic can not be achieved.

Furthermore, the moisture contained in the ambient air enters into the electronic component through a gap between the insulator resin layer and the electrode terminal portion. This brings about corrosion of the conductor pattern and fluctuation of the characteristic. As a result, the quality of the electronic component is considerably deteriorated.

SUMMARY OF THE INVENTION

It is therefore an object of the present invention to provide a highly reliable electronic component which can be easily manufactured and reduced in size and which has characteristics desired.

It is another object of the present invention to provide a circuit element comprising at least one of a low pass filter, a common choke coil, a transformer, an inductance, a capacitance, and an electric resistance each of which is formed as the above-mentioned electronic component.

According to this invention, there is provided an electronic component comprising an insulator substrate, a layered member composed of a plurality of insulator resin layers and a plurality of conductor pattern layers alternately stacked on the insulator substrate to form a first conductor line and a second conductor line each of which comprises at least one conductor layer, first and second external electrode terminal portions connected to opposite ends of the first conductor line and covering first and second areas of side surfaces of the layered member and the insulator substrate, respectively, and a third external electrode terminal portion connected to one end of the second conductor line and covering a third area of the side surfaces of the layered member and the insulator substrate. The first and the second conductor lines have magnetic and electrocapacitive coupling with each other.

According to this invention, there is also provided a common mode choke coil comprising the above mentioned electronic components. The common mode choke coil further comprises a fourth external electrode terminal connected to the other end of the second conductor line and formed on the side surfaces of the layered member and the insulator substrate at a fourth area different from the first through the third external electrode terminal portions. Each of the first and the second conductor lines have a pattern circulated on different conductor layers, the number of turns in both lines being equal to each other. A pair of the first and the third external electrode terminals and another pair of the second and the fourth external electrode terminals serves as an input terminal pair and an output terminal pair, respectively.

According to this invention, there is also provided a transformer comprising the above mentioned electronic component. The transformer further comprises a fourth external electrode terminal connected to the other end of the second conductor line and formed on the side surfaces of the layered member and the insulator substrate at a fourth area different from the first through the third external electrode terminal portions. Each of the first and the second conductor lines have a pattern circulated on different conductor layers. A pair of the first and the second external electrode terminal and another pair of the third and the fourth external connection terminals serves as an input terminal pair and an output terminal pair, respectively.

DESCRIPTION OF THE PREFERRED EMBODIMENT

Figure 1:
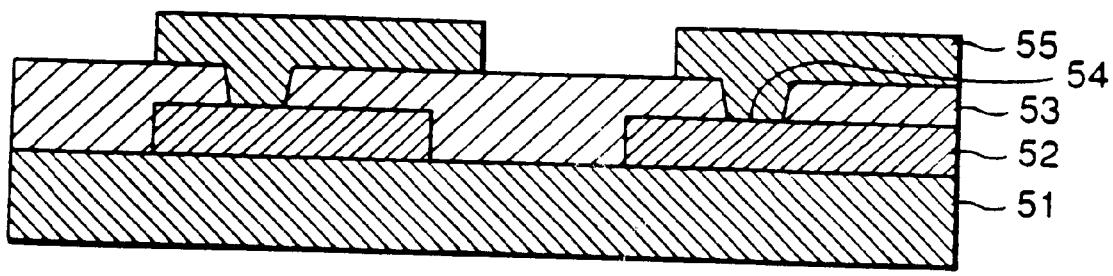
FIG. 1 is a sectional view of a conventional multilayer interconnection board.
Figure 2:
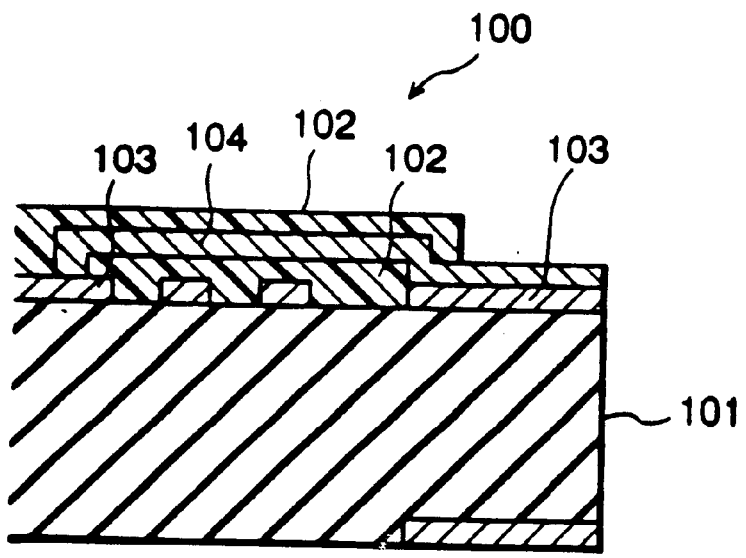
FIG. 2 is a sectional view of a conventional electronic component.

Now, description will be made about preferred embodiments of this invention with reference to the drawing.

Figure 3:
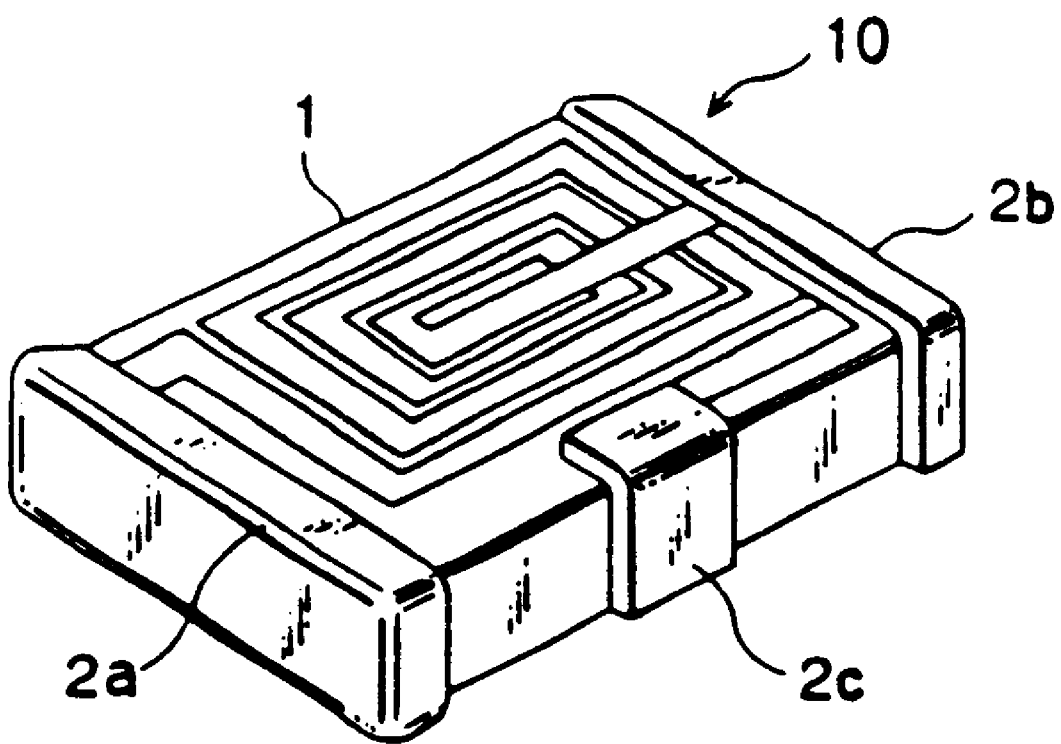
FIG. 3 is a perspective view of a low pass filter as an electronic component according to a first embodiment of this invention.

At first referring to FIG. 3, an electronic component according to a first embodiment of this invention is an EMI filter. As shown in FIG. 3, the electronic component 10 comprises a main body 1 and first through third external electrode terminal portions 2a, 2b, and 2c formed on different side surfaces of the main body 1, respectively, to extend from an end of the upper surface through the side surfaces to an end of the lower surface. Specifically, the first and the second external electrode terminal portions 2a and 2b cover the side surfaces of the main body 1 opposite to each other in a longitudinal direction. The third external electrode terminal portion 2c covers the center area of one of the side surfaces parallel to the longitudinal direction.

Figure 4:
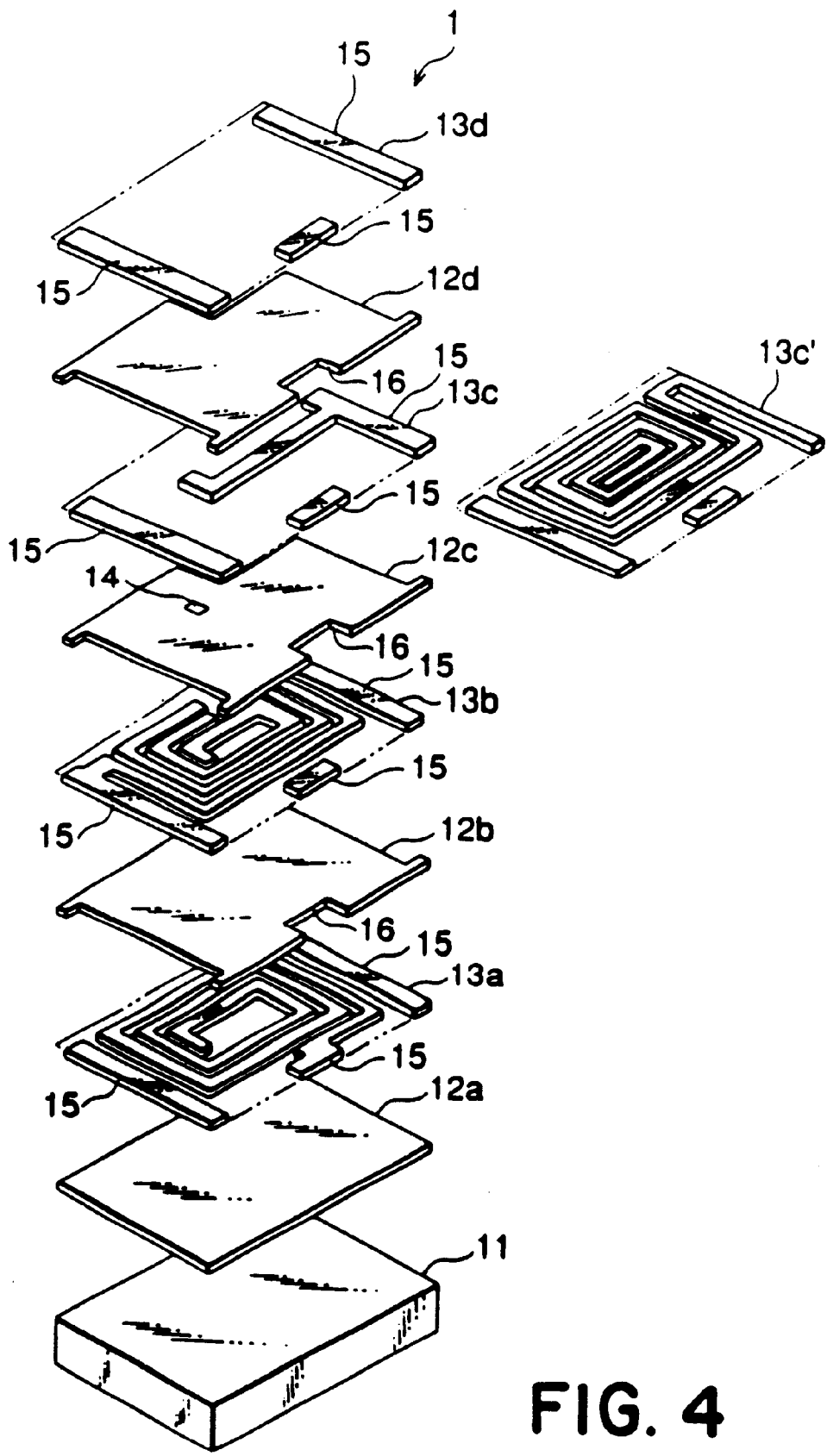
FIG. 4 is an exploded perspective view of the electronic component illustrated in FIG. 3.

Referring to FIG. 4, the main body 1 comprises a ceramics substrate 11 as an insulator substrate, a plurality of insulator resin layers 12a through 12d, and a plurality of conductor pattern layers 13a through 13d. As shown in FIG. 4, the insulator resin layers 12a, 12b, 12c, and 12d and the conductor pattern layers 13a, 13b, 13c, and 13d are alternately stacked on the ceramics substrate 11.

In order to increase the number of turns of a coil of the EMI filter, an additional conductor pattern layer 13c' may be interposed together with an additional insulator layer.

In this embodiment, the ceramics substrate 11 comprises a machinable ceramics material manufactured and sold by Mitsui Mining Material, Co., Ltd. under the trade name "Macerite". The characteristics of the ceramics material are shown in Table 1 in comparison with alumina.

TABLE 1

| | Machinable Ceramics (Macerite) | Alumina |
| --- | --- | --- |
| Vickers Hardness (kg/mm$^2$) | 220 | about 2000 |
| Dielectric Constant $\epsilon$ | 6.5 | 10 |
| Relative Permiability $\mu$ | 1 | 1 |
| Resistivity ($\Omega \cdot$ cm) | $5 \times 10^{15}$ | $10^{14}$ |
| Breakdown Voltage (kv/cm) | 150 | 150 |
| Water Absorption (%) | 0 | 0 |
| Upper Limit Temperature (° C.) | 700 | (1500) |

Each of the insulator resin layers 12a through 12d comprises benzocyclobutene (BCB) as ultraviolet photosensitive resin. The use of BCB as the insulator resin layers achieves an excellent flatness of the insulator resin layers. As a consequence, it is possible to obtain a layered structure having a flat surface without an unevenness. Therefore, the electronic component 10 has excellent electric characteristics.

Referring to FIGS. 5A through 5D, 6A through 6D, and 7A through 7D, a process of forming the layered structure of the insulator resin layers and the conductor pattern layers will be described.

Figure 5A:
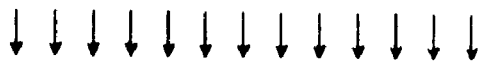
FIGS. 5A through 5D show a first part of a process of forming a layered structure for the electronic component illustrated in FIG. 3.
Figure 5B:

Referring to FIGS. 5A through 5D, the insulator resin layer 12a is formed on the ceramics substrate 11 (now shown) after the ceramics substrate 11 is cleaned by the use of acetone, methylalcohol, or the like. If necessary, the insulator resin layer 12a is cleaned by reverse sputtering, as shown in FIG. 5A. On the insulator resin layer 12a, an underlayer 3 comprising a Ti film and a Cu film is deposited by sputtering, as illustrated in FIG. 5B. In FIG. 5B, the Ti film and the Cu film have a thickness of 0.05 $\mu$ m and a thickness of 0.25–0.3 $\mu$ m, respectively, although not separately shown in the figure.

Figure 5C:
Figure 5D:
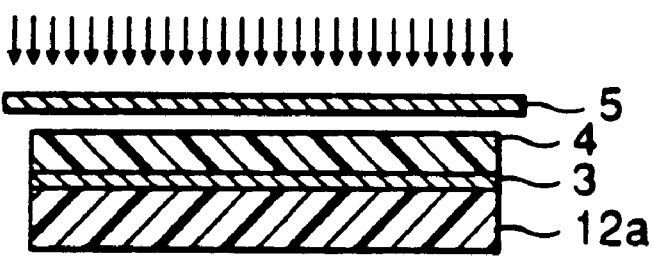

Next, as shown in FIG. 5C, a resist 4 is applied on the underlayer 3. Then, by the use of photolithography, the resist 4 is exposed through a mask 5 and developed, as illustrated in FIG. 5D.

Figure 6A:
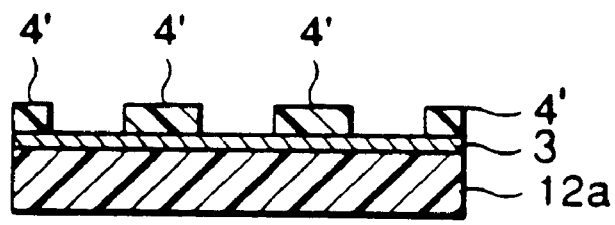
FIGS. 6A through 6D show a second part of the process following the first part illustrated in FIGS. 5A through 5D.
Figure 6B:
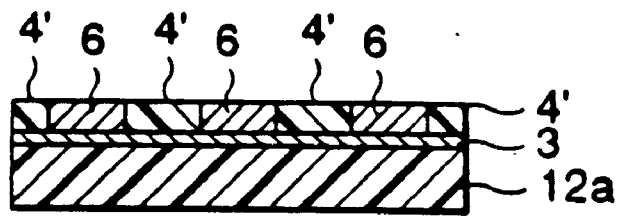

In the above-mentioned manner, a resist pattern 4' is formed as illustrated in FIG. 6A. Then, surface treatment is carried out by the use of $H_2SO_4$. Subsequently, an electrolytic Cu plated layer 6 is formed by electrolytic Cu plating, as illustrated in FIG. 6B.

Figure 6C:
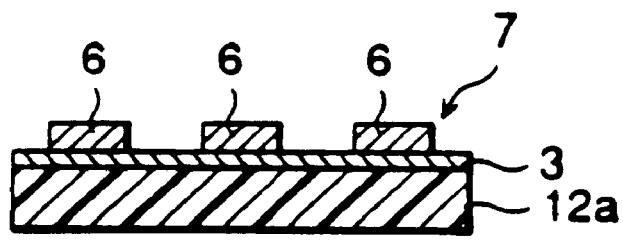

Referring to FIG. 6C, the resist pattern 4' is removed to form an intermediate conductor pattern 7.

Figure 6D:
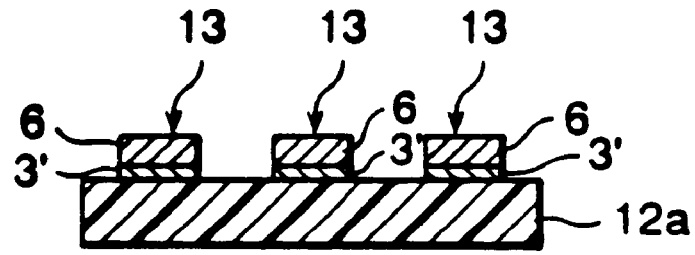

Then, the intermediate conductor pattern 7 illustrated in FIG. 6C is subjected to wet-etching (or dry-etching) to remove those portions of the underlayer 3 exposed without the electrolytic Cu plated layer 6. Then, cleaning is carried out by the use of HC1. As a consequence, an isolated conductor pattern layer 13a is formed on the insulator resin layer 12a, as illustrated in FIG. 6D. Although the upper surface of the Cu plated layer 6 is slightly etched during etching, the intermediate conductor pattern 7 will not be removed because it is thicker than the underlayer 3.

The conductor pattern layer 13a thus obtained comprises the patterns of underlayer 3 and the electrolytic Cu plated layer 6 and has a thickness of about 3–5 $\mu$ m and a width of about 30 $\mu$ m. No trouble or inconvenience has been encountered during cleaning, photolithography, and etching in the manufacturing process.

Figure 7A:
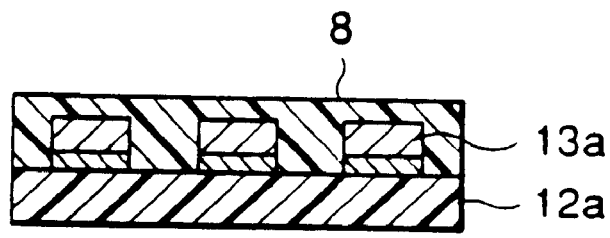
FIGS. 7A through 7D show a third part of the process following the second part illustrated in FIGS. 6A through 6D.
Figure 7B:
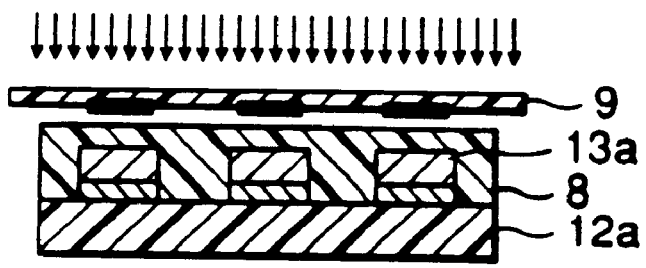
Figure 7C:
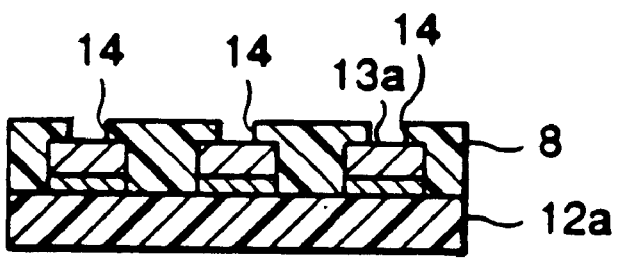

Referring to FIGS. 7A through 7D, formation of another insulator resin layer 12b is described. As shown in FIG. 7A, the conductor pattern layer 13a formed on the insulator resin layer 12a (FIG. 6D) is coated with the ultraviolet photosensitive resin of BCB by spin coating to form an intermediate insulator resin layer 8. Then, by the use of photolithography, the intermediate insulator resign layer 8 is exposed through a mask 9, as illustrated in FIG. 7B. As a result, through holes 14 are formed in the intermediate insulator resin layer 8, as illustrated in FIG. 7C. The through holes 14 serve to establish electrical contact between the conductor pattern layer 13a and another conductor pattern layer formed above. It is therefore unnecessary to form the through holes 14 over the entire surface of the conductor pattern layer 13a.

Figure 7D:
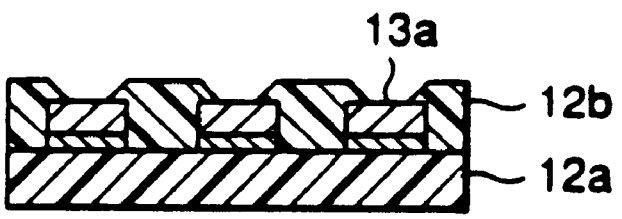

Then, half-curing is carried out in the nitrogen atmosphere at 210° C. for 30 minutes to obtain the insulator resin layer 12b illustrated in FIG. 7D.

The other conductor layers 13b, 13c, and 13d illustrated in FIG. 4 are formed in the manner similar to that described in conjunction with FIGS. 5A through 5D and 6A through 6D. The other insulator layers 12c and 12D are formed in the manner similar to that described in conjunction with FIGS. 7A through 7D.

Figure 8:
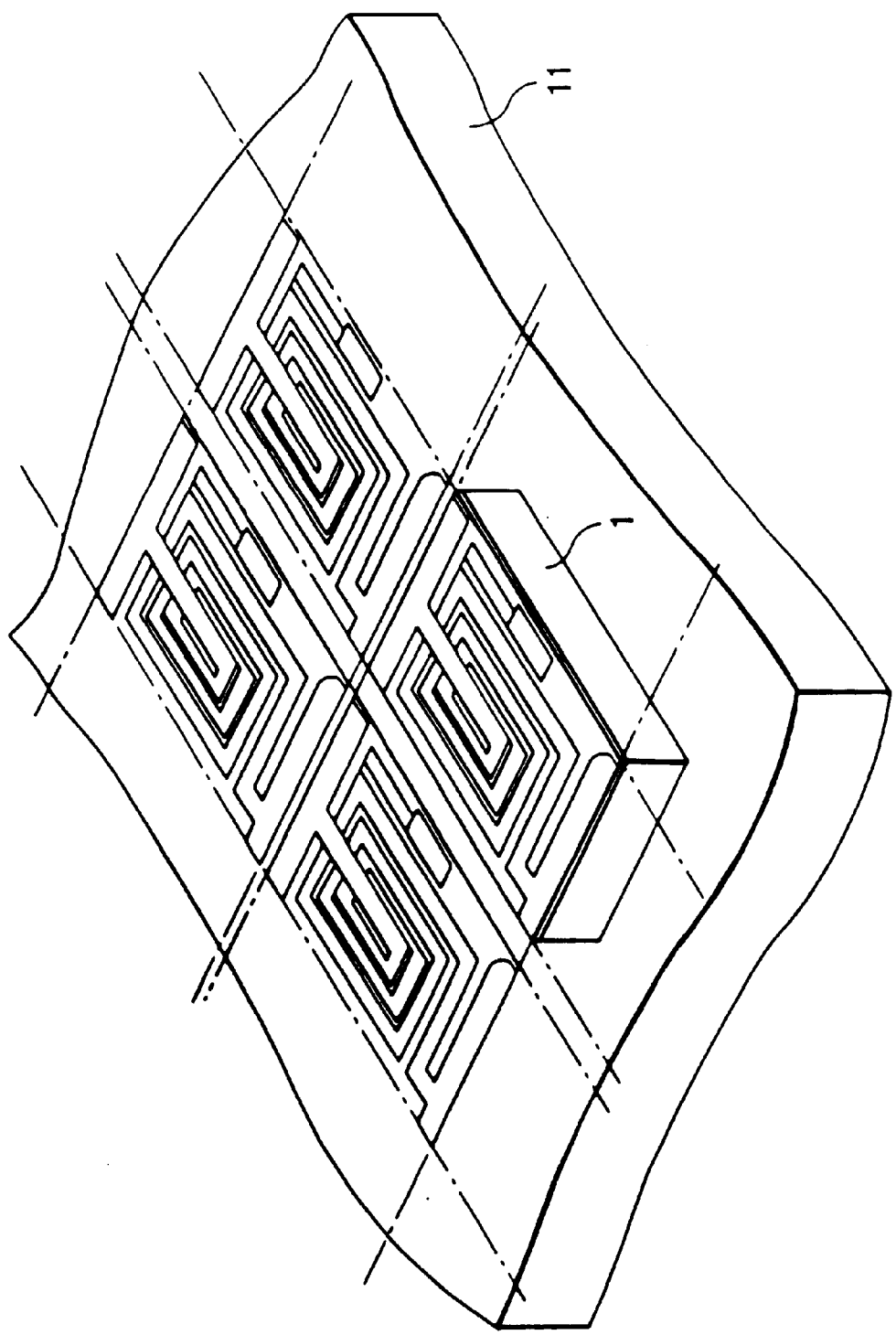
FIG. 8 is a perspective view of showing a plurality of the layered structures formed on an insulator substrate of a large size before separation into the individual electronic components.

By repeating the above-mentioned steps, a plurality of main bodies 1 of the electronic components 10 are formed on the insulator substrate, as shown in FIG. 8.

Figure 9:
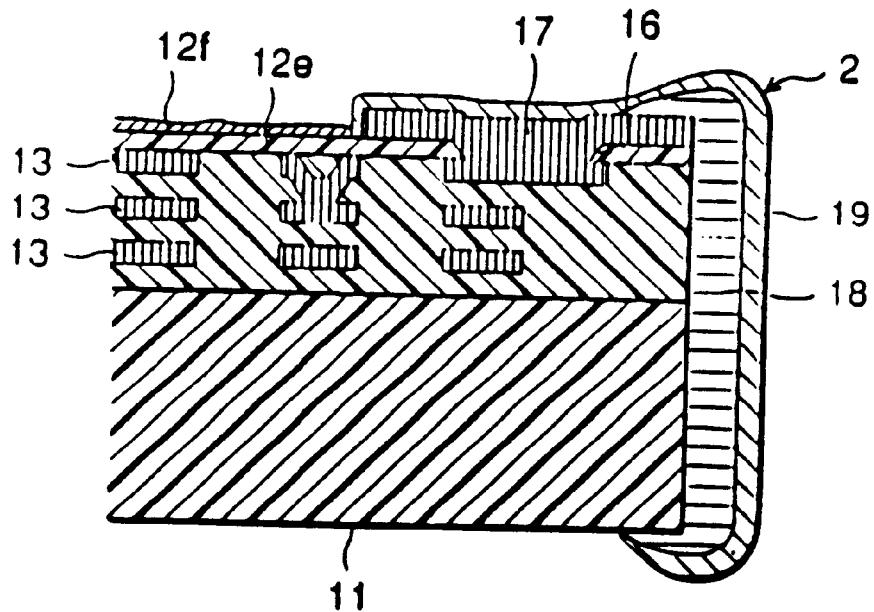
FIG. 9 is a sectional view of a terminal structure formed on one of the electronic components cut from the insulator substrate illustrated in FIG. 8.

Next referring to FIG. 9, description proceeds to a step of forming the external electrode terminal portion (simply depicted at 2) on the main body 1 of each of the electronic components shown in FIG. 8. In the state illustrated in FIG. 8, the conductor pattern is exposed in the upper surface of the main body 1. Before separating the individual main bodies 1 by cutting, an external surface of each main body 1 is covered with an insulator resin layer 12e. In addition, an electrode extracting portion 16 in the form of a through hole is formed in the manner similar to that described above. Then, the electrode extracting portion 16 is filled with a conductive metal material, for example, Cu, to form an electrode extracting pattern 17. In addition, a protection layer 12f of, for example, polyimide, is formed on a surface region of the insulator resin layer 12e which is not covered with the electrode extracting pattern 17. The protection layer 12f may be made of any appropriate material selected from various materials such as those specified in Table 2 in dependence upon the applications.

TABLE 2

| Material of Insulator Layer in Multilayer Structure | Protection Layer | Effect | |
|---|---|---|---|
| BCB (Benzo-cyclobutene) (Water Absorption 0.25%) | Polyimide Epoxy | 1. | Improvement of Mechanical Strength → Reduction of Defects upon Mounting between Steps |
| | | 2. | Assurance of Fire Proofness (Shielding BCB from Atmosphere (oxygen)) |
| | | 3. | Easy Application (Spin Coater) Formation at Low Temperature → Low Cost |
| | SiO$_2$ (CVD Deposition) Si$_3$N$_4$ (CVD Deposition) | 1. | Improvement of Mechanical Strength |
| | | 2. | Assurance of Fire Proofness |
| | | (3. | Further Improvement of Anti-Humidity) |
| Polyimide (Water Absorption 0.25%) | BCB (Benzo-cyclobutene) | 1. | Improvement of Anti-Humidity |
| | | 2. | Low Cost (Spin Coater, Formation at Low Temperature) |
| | SiO$_2$ (CVD Film) Si$_3$N$_4$ (CVD Film) | 1. | Improvement of Anti-Humidity |
| | | (3. | Further Improvement of Mechanical Strength) |

The ceramics substrate (FIG. 8) with a plurality of the main bodies 1 formed thereon is cut by a dicing saw along a dash-and-dot line. Thus, the individual main bodies 1 are separated. In FIG. 8, one of the main bodies 1 is depicted by the solid line.

Then, the main body 1 is cleaned by the use of 5% HC1 solution. Thereafter, Ni conductive paste comprising, for example, epoxy resin containing Ni powder is applied to an area from an end portion of the electrode extracting pattern 17 through the side surface to the lower surface of the main body 1 and is subjected to thermosetting or thermal curing. Next, ultrasonic cleaning is carried out by the use of both a KOH solution and a H$_2$SO$_4$ solution as a pretreatment prior to plating. Thereafter, a Ni plated film 18 is formed as an underlayer by electrolytic barrel plating of a nickel sulfanate bath. Herein, Ni is excellent in electrolysis migration and serves to protect the internal diffusion of solder or the like. Thereafter, a solder plated film 19 is formed on the Ni plated film 18 by electrolysis barrel plating of a tin-lead alkanolsulfonate bath. The tin-lead alkanolsulfonate bath prevents the deterioration of the insulator resin layer because no chelating agent is contained. It is noted here that the solder plated film 19 can be formed by a phenolsulfonate plating bath. A tin plated film may be formed instead of the solder plated film.

In the above-mentioned terminal structure, the electrode extracting pattern 17 is formed above the insulator resin layer 12 at the interface between the electrode extracting pattern 17 and the insulator resin layer. Therefore, the separation therebetween hardly occurs so that external moisture is effectively prevented from entering.

Figure 10:
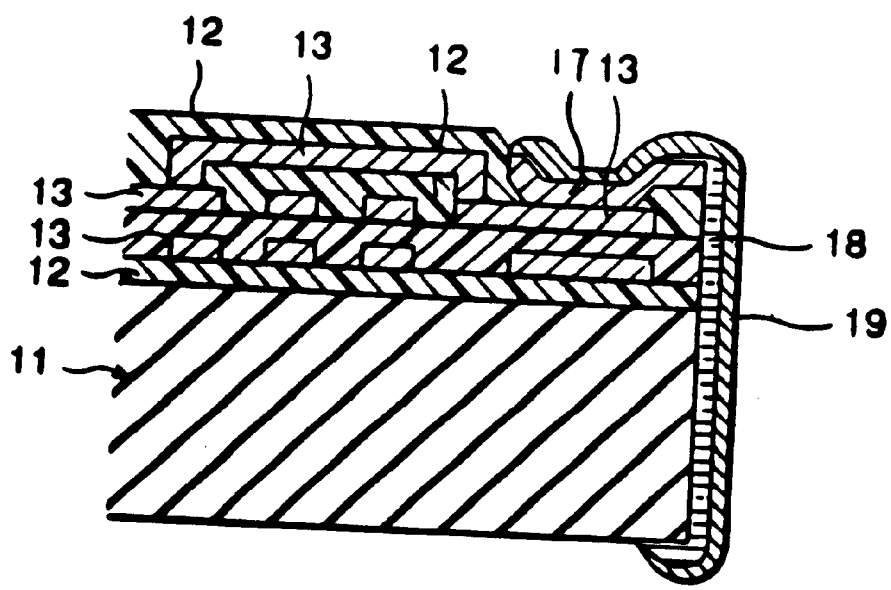
FIG. 10 shows another terminal structure for an electronic component having a three terminal structure.

Referring to FIG. 10, another terminal structure of an electronic component according to a second embodiment of this invention will be described. In FIG. 8, a three terminal structure used in the EMI filter, LCR parts, and the like, is illustrated. The electrode extracting pattern 17 is connected to the second conductor pattern layer 13 counted from the topmost conductor pattern layer 13. The protection film is not shown in the figure.

Figure 11:
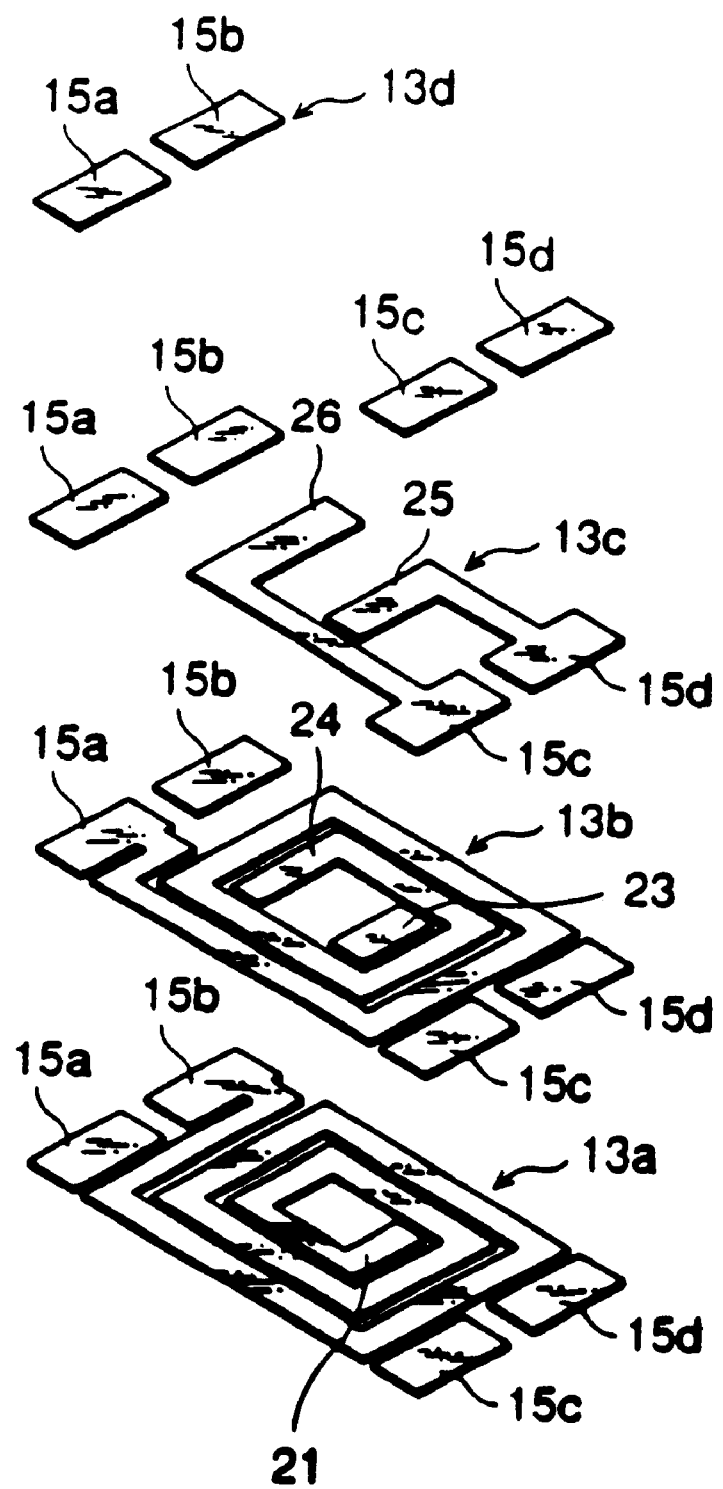
FIG. 11 is an exploded perspective view of conductor patterns of a common mode choke coil as another electronic component according to a second embodiment of this invention.

Referring to FIG. 11, a common mode choke coil according to a third embodiment of this invention has first through fourth conductor pattern layers 13a through 13d. Practically, in the manner similar to that illustrated in FIG. 3, the first through the fourth conductor pattern layers 13a through 13d are successively stacked with the insulator resin layers interposed therebetween although the insulator resin layers are not shown in FIG. 11 for convenience of illustration. In FIG. 11, each of the first through the fourth conductor pattern layers 13a through 13d has end patterns 15a through 15d. The end patterns 15a of the first through the fourth conductor pattern layers 13a through 13d are overlapped on one another through notches formed in the insulator resin layers to be electrically connected. Likewise, the end patterns 15b, 15c, and 15d are respectively overlapped and electrically connected. The end portion of a conductor pattern 21 of the first or the lowest conductor pattern layer 13a is connected through a central conductor pattern 23 of the second conductor pattern layer 13b to the end portion of an extracting conductor pattern 25 of the third conductor pattern layer 13c. In this structure, the end portions 15b and 15d of the conductor patterns serve as opposite ends of a single circulated conductor line. On the other hand, a circulating conductor pattern 24 of the second conductor pattern layer 13b is connected to the end portion of an extracting conductor pattern 26 of the third conductor pattern layer 13c. In this structure, the end portions 15a and 15c of the conductor patterns serve as opposite ends of another circulated conductor line. These conductor lines have the same number of turns.

Figure 12:
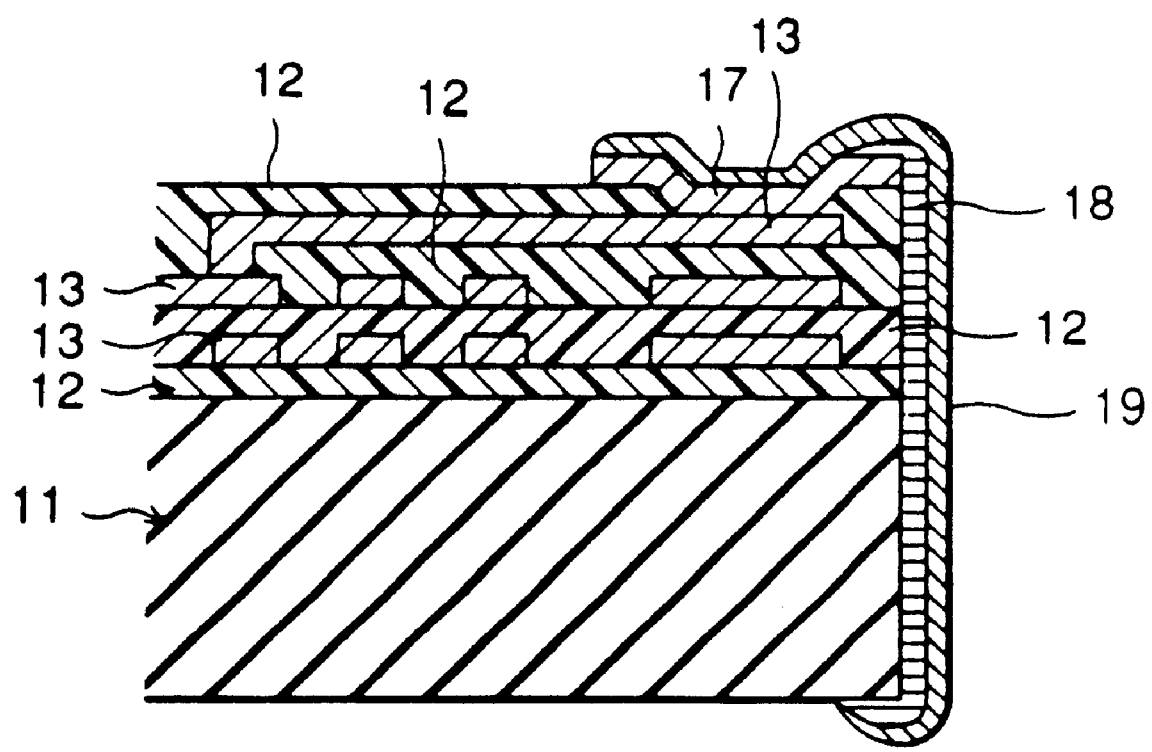
FIG. 12 is a partial sectional view of a terminal structure of the common choke coil illustrated in FIG. 11.

FIG. 12 shows the structure of the terminal portion of the electronic component illustrated in FIG. 11. In FIG. 12, the terminal portion is shown for one of four terminal structures. The electrode extracting pattern 17 is connected to the uppermost conductor pattern layer 13. The protection film is not shown in the figure.

Figure 13:
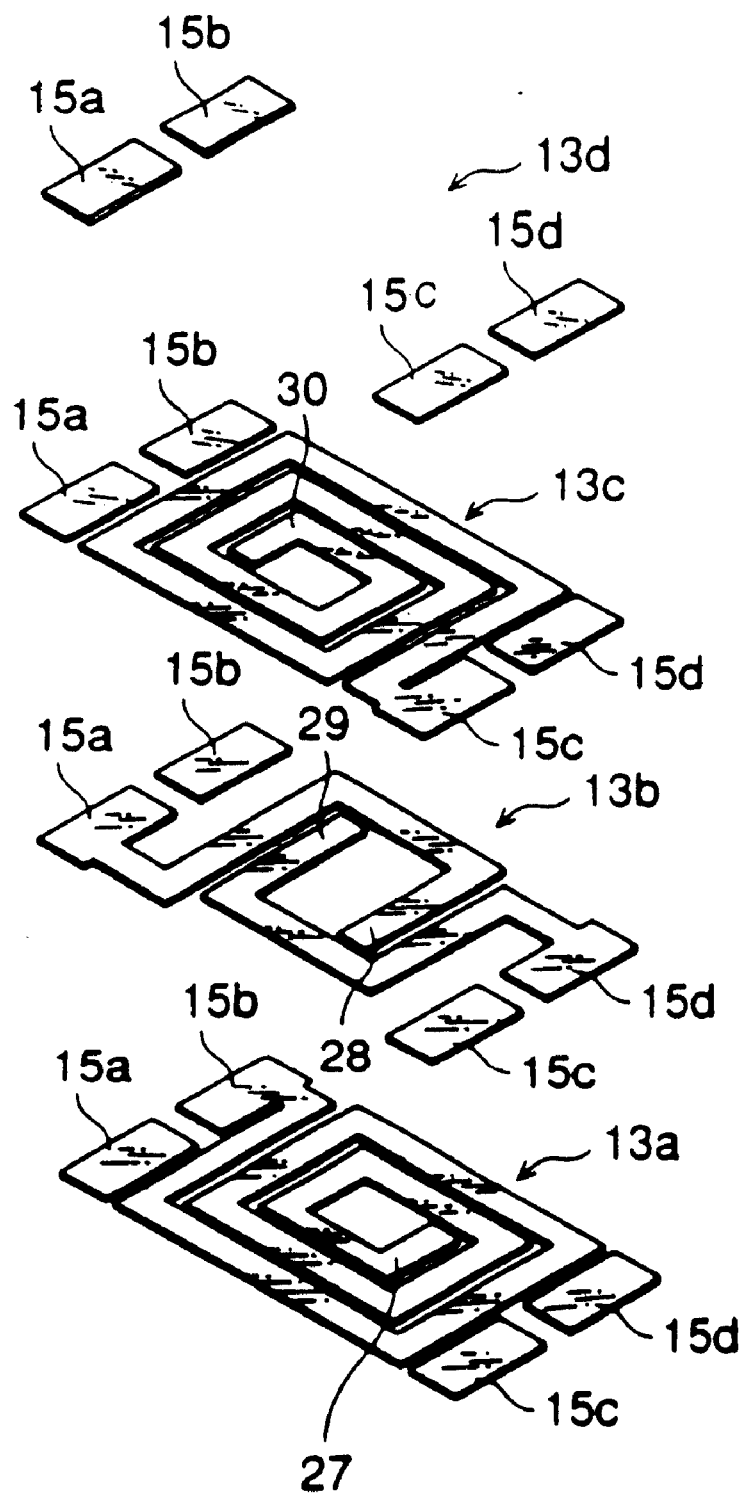
FIG. 13 is an exploded perspective view of conductor patterns of a transformer as still another electronic component according to a third embodiment of this invention.

Referring to FIG. 13, a transformer according to a fourth embodiment of the present invention has first through fourth conductor pattern layers 13a through 13d. Practically, in the manner similar to that illustrated in FIG. 4, the first through the fourth conductor pattern layers 13a through 13d are successively stacked with the insulator resin layers interposed therebetween. In FIG. 13, each of the conductor pattern layers 13a through 13d has end patterns 15a through 15d. The end patterns 15a are overlapped on one another through notches formed in the insulator resin layers to be electrically connected. Likewise, the end patterns 15b, 15c, and 15d are respectively overlapped and electrically connected. The end portion of a circulated conductor pattern 27 of the first conductor pattern layer 13a is connected to the end portion of an extracting conductor pattern 28 of the second conductor pattern layer 13b. In this structure, the end portions 15a and 15b of the conductor patterns serve as opposite ends of a single circulated conductor line. On the other hand, the end portion of a circulating conductor pattern 30 of the third conductor pattern layer 13c is connected to another extracting conductor pattern 29 of the second conductor pattern layer 13b. In this structure, the end portions 15c and 15d of the conductor patterns serve as opposite ends of another circulated conductor line. The turn ratio of these conductor lines is 1:n.

In the common mode choke coil (FIG. 11) and the transformer (FIG. 13), each of the conductor pattern layers is formed in the manner described in conjunction with FIGS. 5A through 5D and 6A through 6D. The insulator resin layers which are not shown in FIGS. 11 and 13 are formed in the manner described in conjunction with FIGS. 7A through 7D. In either case, the terminal structure illustrated in FIG. 12 is used.

In either case, a plurality of the above-mentioned electronic components are simultaneously formed on the insulator substrate 11 of a large size in the manner similar to that described in conjunction with FIG. 8. After separation into each individual component, the terminal structure is formed. The cutting operation is easily carried out if the insulator substrate comprises a machinable material, for example, having a Vickers hardness within the range between 100 and 1000. Thus, the cost can be reduced.

Although the foregoing embodiments have been directed to the low pass filter, the common mode choke coil, and the transformer, this invention is also applicable to an element such as an inductor, a capacitor, or an electric resistance element.

As thus far been described, the electronic component of this invention can be easily manufactured and reduced in size, has desired characteristics, and is highly reliable.

Furthermore, a circuit element comprising at least one of the low pass filter, the common mode choke coil, the transformer, the inductance, the capacitance, and the electric resistance each of which is formed as the electronic component is obtained according to the present invention.

What is claimed is:

1. A common mode choke coil comprising:

an insulator substrate;

a layered member composed of a plurality of insulator resin layers and a plurality of conductor pattern layers alternately stacked on said insulator substrate to form a first conductor line and a second conductor line, each of which comprises at least one conductor layer, said layered member stacked on said substrate having side surfaces on which first, second, third and fourth areas are defined, respectively, said first and second conductor lines having magnetic and electrocapacitive coupling with each other;

first and second external electrode terminal portions connected to opposite ends of said first conductor line and covering first and second areas of side surfaces of said layered member and said insulator substrate, respectively;

a third external electrode terminal portion connected to one end of said second conductor line and covering a third area of the side surface of said layered member and said insulator substrate;

a fourth external electrode terminal connected to the other end of said second conductor line and formed on the side surfaces of said layered member and said insulator substrate at said fourth area different from said first through said third external electrode terminal portions;

said first and said second conductor lines having spiral patterns on different conductor layers, the number of turns in both lines being equal to each other and each forming at least one spiral turn;

a pair of said first and said third external electrode terminals and another pair of said second and said fourth external electrode terminals serving as an input terminal pair and an output terminal pair, respectively; and first through fourth electrode extracting structures including said first through said fourth electrode terminal portions, each of said first through fourth electrode extracting structures comprising:

the uppermost one of said insulator resin layers of said common mode choke coil provided with an electrode extracting portion formed as a notch or a through hole penetrating said uppermost insulator resin layer to reach an underlying one of said conductor pattern layers; and an electrode extracting pattern filled in said electrode extracting portion, said electrode extracting pattern being connected to a corresponding one of said first, said second, said third and said fourth external electrode terminal portions.

2. A common mode choke coil as claimed in claim 1, wherein said insulator substrate is made of a machinable material having a Vickers hardness within the range between 600 and 1,000.

3. A common mode choke coil as claimed in claim 1, wherein each of said conductor pattern layers comprises an underlying layer of a conductor metal film and a Cu plated film formed on said underlying layer by electrolytic plating.

4. A common mode choke coil as claimed in claim 3, wherein said underlying layer comprises a Ti film or a Cr film formed by sputtering.

5. A common mode choke coil as claimed in claim 1, which further comprises a protection resin layer formed on the uppermost one of said insulator resin layers.

6. A common mode choke coil as claimed in claim 1, wherein each of said first, said second, and said third external electrode terminal portions comprises:

a conductor resin layer connected to said conductor pattern layers; and a metal plated film to cover said conductor resin layer.

7. A common mode choke coil as claimed in claim 6, wherein said conductor resin layer substantially comprises a mixture of resin and Ni powder.

8. A common mode choke coil as claimed in claim 6, wherein said metal plated film comprises:

an anti-diffusion film; and an external connection film of one selected from the group consisting of a solder film and a tin film formed on said anti-diffusion film.

9. A common mode choke coil as claimed in claim 8, wherein:

said anti-diffusion film is an Ni plated film formed by electrolytic barrel plating of a nickel sulfamate bath;

said external connection film is a solder plated film formed by electrolytic barrel plating of a tin-lead alkanolsulfonate bath.

10. A common mode choke coil as claimed in claim 8, wherein said external connection film is a solder plated film formed by electrolytic barrel plating of a phenolsulfonate solder bath.

11. A common mode choke coil as set forth in claim 1, wherein each of said insulator resin layers is substantially fabricated of benzocyclobutene resin.

12. A common mode choke coil comprising:

an insulator substrate;

a layered member composed of a plurality of insulator resin layers and a plurality of conductor pattern layers alternately stacked on said insulator substrate to form a first conductor line and a second conductor line each of which comprises at least one conductor layer, said layered member stacked on said substrate having side surfaces on which first, second, third and fourth areas are defined, respectively, said first and said second conductor lines having magnetic and electrocapacitive coupling with each other;

first and second external electrode terminal portions connected to opposite ends of said first conductor line and covering first and second areas of side surfaces of said layered member and said insulator substrate, respectively;

a third external electrode terminal portion connected to one end of said second conductor line and covering a third area of the side surfaces of said layered member and said insulator substrate;

a fourth external electrode terminal connected to the other end of said second conductor line and formed on the side surfaces of said layered member and said insulator substrate at said fourth area different from said first through said third external electrode terminal portions;

said first and second conductor lines having spiral patterns on different conductor layers, the number of turns in both lines being equal to each other; and a pair of said first and said third external electrode terminals and another pair of said second and said fourth external electrode terminals serving as an input terminal pair and an output terminal pair, respectively; and first through fourth electrode extracting structures including said first through fourth external electrode terminal portions, each of said first through fourth external electrode terminal portions comprising:

a conductor resin layer formed on the corresponding side surface area of said layered member and said insulator substrate, anti-diffusion film plated on said conductor resin layer; and an external connection film of a solder film or a tin film formed on said anti-diffusion film;

each of said first through fourth electrode extracting structures comprising:

the uppermost one of said insulator resin layers of said common mode choke coil provided with an electrode extracting aperture portion formed as a notch or a through hole penetrating said uppermost insulator resin layer to reach an underlying one of said conductor pattern layers adjacent each of said first, second, third and fourth external electrode terminal portions;

an electrode extracting pattern filled in said electrode extracting aperture portion and extending on the portion of said uppermost insulator resin layer surrounding the edge of said electrode extracting aperture portion, said electrode extracting pattern being connected to said conductor resin layer, said external connection film extending on and overlying said electrode extracting pattern; and a protection resin layer formed on the uppermost one of said insulator resin layers and having an edge portion in contact with said external connection film.

* * * * *